(12) United States Patent
Zhang et al.

(10) Patent No.: US 8,667,378 B2
(45) Date of Patent: Mar. 4, 2014

(54) DECODING METHOD AND DEVICE FOR CONCATENATED CODE

(75) Inventors: Tao Zhang, Shenzhen (CN); Yueyi You, Shenzhen (CN); Nanshan Cao, Shenzhen (CN); Yangzhong Yao, Shenzhen (CN)

(73) Assignee: ZTE Corporation, Shenzhen (CN)

( * ) Notice: Subject to any disclaimer, the term of this patent is extended or adjusted under 35 U.S.C. 154(b) by 98 days.

(21) Appl. No.: 13/512,196

(22) PCT Filed: Oct. 22, 2010

(86) PCT No.: PCT/CN2010/077975
§ 371 (c)(1),
(2), (4) Date: May 25, 2012

(87) PCT Pub. No.: WO2011/085605
PCT Pub. Date: Jul. 21, 2011

(65) Prior Publication Data
US 2012/0284584 A1  Nov. 8, 2012

(30) Foreign Application Priority Data
Jan. 15, 2010 (CN) .......... 2010 1 0003431

(51) Int. Cl.
*H03M 13/00* (2006.01)
*H03M 13/03* (2006.01)
*G06F 11/00* (2006.01)

(52) U.S. Cl.
USPC ............ 714/784; 714/758; 714/790; 714/800

(58) Field of Classification Search
USPC ......... 714/784, 790, 800, 803–804, 799, 782, 714/781, 752, 755, 756, 758
See application file for complete search history.

(56) References Cited

U.S. PATENT DOCUMENTS 7,000,168 B2 * 2/2006 Kurtas et al. .................. 714/755
8,407,556 B2 * 3/2013 Shen et al. .................... 714/755
(Continued)

FOREIGN PATENT DOCUMENTS

CN 1599262 3/2005
CN 101013931 8/2007
(Continued)

OTHER PUBLICATIONS

Xie et al., Concatenated Low-Density Parity-Check and BCH Coding System for Magnetic Recording Read Channel with 4kB Sector Format, IEEE Transactions on Magnetics, vol. 44, No. 12, Dec. 2008, pp. 4784-4789.

*Primary Examiner* — Christine Tu
(74) *Attorney, Agent, or Firm* — Pearl Cohen Zedek Latzer Baratz LLP

(57) ABSTRACT

Disclosed are a decoding method and device for concatenated code, for the decoding of concatenated code composed of low density parity code (LDPC) and Reed-Solomon (RS) code. The method includes carrying out LDPC soft decision iterative decoding on bit de-interleaved data flow, and carrying out check decision on LDPC codeword obtained from decoding by using a check matrix; carrying out de-byte-interleave on an information bit of the LDPC codeword obtained from decoding and converting check information of the LDPC codeword into puncturing information of RS codeword; selecting a decoding mode according to the puncturing information of the RS codeword to carry out RS decoding. By way of the solution of the present invention, the RS decoding performance can be improved without increasing the computation complexity, thus greatly improving the receiving performance of the CMMB terminal as compared to the conventional method.

12 Claims, 2 Drawing Sheets

(56) References Cited

U.S. PATENT DOCUMENTS

| | | | |
|---|---|---|---|
| 8,549,375 B2 * | 10/2013 | Ueng et al. | 714/752 |
| 2004/0199847 A1 | 10/2004 | Calabro et al. | |
| 2006/0224935 A1 | 10/2006 | Cameron et al. | |
| 2008/0133999 A1 | 6/2008 | Kondo et al. | |
| 2013/0232389 A1 * | 9/2013 | Varnica et al. | 714/752 |

FOREIGN PATENT DOCUMENTS

| | | |
|---|---|---|
| CN | 101309086 | 11/2008 |
| CN | 101345607 | 1/2009 |
| KR | 10-2008-0076613 | 8/2008 |

* cited by examiner

DECODING METHOD AND DEVICE FOR CONCATENATED CODE

CROSS-REFERENCE TO RELATED APPLICATIONS

This application is a National Phase Application of PCT International Application No. PCT/CN2010/077975, entitled "DECODING METHOD AND DEVICE FOR CONCATENATED CODE", International Filing Date Oct. 22, 2010, published on Jul. 21, 2011 as International Publication No. WO 2011/085605, which in turn claims priority from Chinese Patent Application No. 201010003431.5, filed Jan. 15, 2010, both of which are incorporated herein by reference in their entirety.

TECHNICAL FIELD

The present invention relates to the technical field of China mobile multimedia broadcasting (abbreviated as CMMB), and particularly, to a decoding method and device for concatenated code.

BACKGROUND OF THE RELATED ART

The effectiveness and reliability of information transmission are two important indices for evaluating the communication system, and in order to increase the reliability of information transmission, it is usually required to carry out channel encoding on the information so as to increase certain redundancy and enable the codeword to have automatic error check and error correction abilities. However, more redundancy does not mean much better, in order to take the effectiveness of information transmission into consideration, it is hoped that better decoding performance at the receiver can be obtained by way of designing an excellent decoding method in case of certain redundancy. A simulation model of the digital communication system is as shown in FIG. 1.

Low Density Parity Check (abbreviated as LDPC) code is a sparse check matrix based linear packet code proposed by Gallager in 1962. In 1996, MacKay and Neal rediscovered the LDPC code and proved that its performance is quite approximate to Shannon's limit. In some existing communication systems, such as DVB (Digital Video Broadcasting), WiMAX (Worldwide Interoperability for Microwave Access) and CMMB systems, the LDPC code is used as channel encoding. According to the distribution of element 1 in the check matrix H of the LDPC code, the LDPC code generated thereby can be divided into regular code and irregular code: if there are r fixed 1 in each row of the matrix H and there is c fixed 1 in each column, then the LDPC code generated thereby is referred to as (c,r) regular code; and if the number of element 1 is unfixed in the row and column of H, the LDPC code generated thereby is an irregular code. In the CMMB system, the (3,6) regular code with 1/2 code rate and (3,12) regular code with 3/4 code rate are taken as a part of channel encoding, and the codeword lengths thereof are both 9216.

In the CMMB system, the check matrix H of the LDPC code can be created by cycle shift using a codebook. When 1/2 code rate is used, the codebook is a 18×6 matrix, and what is stored therein is the locations of non-zero elements of the previous 18 rows of the H matrix, and the codebook can be circularly right shifted by 36 bits every 18 rows to obtain the locations of the non-zero elements of other rows of the H matrix. When 3/4 code rate is used, the codebook is a 9×12 matrix, and what is stored therein is the locations of non-zero elements of the previous 9 rows of the HH matrix, and the codebook can be circularly right shifted by 36 bits every 9 rows to obtain the locations of the non-zero elements of other rows of the H matrix. Such structure can greatly reduce the storage space of the H matrix.

The codebook to generate the H matrix when 1/2 code rate is used is as follows:

| 0, | 6, | 12, | 18, | 25, | 30 |
|---|---|---|---|---|---|
| 0, | 7, | 19, | 26, | 31, | 5664 |
| 0, | 8, | 13, | 20, | 32, | 8270 |
| 1, | 6, | 14, | 21, | 3085, | 8959 |
| 1, | 15, | 27, | 33, | 9128, | 9188 |
| 1, | 9, | 16, | 34, | 8485, | 9093 |
| 2, | 6, | 28, | 35, | 4156, | 7760 |
| 2, | 10, | 17, | 7335, | 7545, | 9138 |
| 2, | 11, | 22, | 5278, | 8728, | 8962 |
| 3, | 7, | 2510, | 4765, | 8637, | 8875 |
| 3, | 4653, | 4744, | 7541, | 9175, | 9198 |
| 3, | 23, | 2349, | 9012, | 9107, | 9168 |
| 4, | 7, | 29, | 5921, | 7774, | 8946 |
| 4, | 7224, | 8074, | 8339, | 8725, | 9212 |
| 4, | 4169, | 8650, | 8780, | 9023, | 9159 |
| 5, | 8, | 6638, | 8986, | 9064, | 9210 |
| 5, | 2107, | 7787, | 8655, | 9141, | 9171 |
| 5, | 24, | 5939, | 8507, | 8906, | 9173 |

The codebook to generate the H matrix when 3/4 code rate is used is as follows:

| 0, | 3, | 6, | 12, | 16, | 18, | 21, | 24, | 27, | 31, | 34, | 7494 |
|---|---|---|---|---|---|---|---|---|---|---|---|
| 0, | 4, | 10, | 13, | 25, | 28, | 5233, | 6498, | 7018, | 8358, | 8805, | 9211 |
| 0, | 7, | 11, | 19, | 22, | 6729, | 6831, | 7913, | 8944, | 9013, | 9133, | 9184 |
| 1, | 3, | 8, | 14, | 17, | 20, | 29, | 32, | 5000, | 5985, | 7189, | 7906 |
| 1, | 9, | 4612, | 5523, | 6456, | 7879, | 8487, | 8952, | 9081, | 9129, | 9164, | 9214 |
| 1, | 5, | 23, | 26, | 33, | 35, | 7135, | 8525, | 8983, | 9015, | 9048, | 9154 |
| 2, | 3, | 30, | 3652, | 4067, | 5123, | 7808, | 7838, | 8231, | 8474, | 8791, | 9162 |
| 2, | 35, | 3774, | 4310, | 6827, | 6917, | 8264, | 8416, | 8542, | 8834, | 9044, | 9089 |
| 2, | 15, | 631, | 1077, | 6256, | 7859, | 8069, | 8160, | 8657, | 8958, | 9094, | 9116 |

The output codeword $C=\{c_0, c_1, \ldots, c_{9215}\}$ of LDPC consists of an input information bit $S=\{s_0, s_1, \ldots, s_{K-1}\}$ and a check bit $P=\{p_0, p_1, \ldots, p_{9215-K}\}$, as shown in the following formula:

$$c_{COL\_ORDER(i)} = \begin{cases} p_i & 0 \leq i \leq 9215 - K \\ s_{i+K-9216} & 9216 - K \leq i \leq 9215 \end{cases}$$

Where COL_ORDER(i) is a codeword bit mapping vector, K is the information bit length (K=4608 when 1/2 code rate is used, and K=6912 when 3/4 code rate is used).

In the CMMB system, RS (Reed Solomon) code is also employed as an external code to form a concatenated code with the LDPC code, and the encoding flow is as shown in FIG. 2. Each code element of the RS code is taken from a limited domain GF (256) and is a shortened code of (240,k), and k can take the value of 176, 192, 224, and 240, and according to different values, RS codes with different error correction ability can be obtained.

The decoding of the LDPC code usually employs a BP algorithm based soft decision decoding algorithm, such as normalized Min-Sum algorithm. The decoding method of RS code usually includes error correction decoding and erasure decoding, which has better decoding performance as compared to error correction decoding. Currently, as to the concatenated code composed of RS code and LDPS code, the conventional decoding algorithm is merely to store the decoding result of the LDPC code into a byte interleaver and then directly carry out RS decoding, therefore, only error correction decoding can be performed on RS code, which affects the decoding performance of the concatenated code to a certain extent.

SUMMARY OF THE INVENTION

The present invention provides a decoding method and device for concatenated code, so as to improve the decoding performance of the concatenated code of RS code and LDPC code and solve the problem in the related art that the performance of the concatenated code is poor.

The present invention provides a decoding method for cascade codes, wherein the method is used for the decoding of cascade codes composed of low density parity code (LDPC) and Reed-Solomon (RS) code, the method comprising:

carrying out LDPC soft decision iterative decoding on bit de-interleaved data flow, and carrying out check decision on LDPC codeword obtained from decoding by using a check matrix;

carrying out de-byte-interleave on an information bit of the LDPC codeword obtained from decoding and converting check information of the LDPC codeword into puncturing information of RS codeword; and selecting a decoding mode according to the puncturing information of the RS codeword to carry out RS decoding.

The step of carrying out check decision on LDPC codeword obtained from decoding by using a check matrix comprises: multiplying a check matrix H by a transposed matrix of a hard decision codeword C obtain from decoding, if a product is zero, then deciding that the codeword C is checked to be correct, and recording that a value of an error flag corresponding to the codeword C is correct; if the product is not zero, then deciding that the codeword C is checked to be error, and recording that the value of the error flag corresponding to the codeword C is error. The step of converting check information of the LDPC codeword into puncturing information of RS codeword comprises: repeating the error flag corresponding to each LDPC codeword for L times to be the puncturing information of a column corresponding to that LDPC codeword, wherein L is a ratio of length of the information bit of that LDPC codeword to length of the column of an interleaver, and L is an positive integral number. The step of selecting a decoding mode according to the puncturing information of the RS codeword to carry out RS decoding comprises: if a number of locations to be punctured of the RS codeword is within in a correctable range of RS erasure decoding, then selecting an erasure decoding mode; if the number of the locations to be punctured is not within in the correctable range of the RS erasure decoding, then selecting an error correction decoding mode. The number of locations to be punctured of the RS codeword being within in the correctable range of the RS erasure decoding refers to: the number of the locations to be punctured is less than or equal to a number of RS check bits of the RS codeword.

The step of carrying out de-byte-interleave on the LDPC codeword obtained from decoding comprises: writing the LDPC codeword obtained from decoding into the interleaver in order of column and reading the same out in order of row.

The present invention also provides a decoding device for concatenated code, comprising a low density parity code (LDPC) decoding module, a de-byte-interleave module and a Reed-Solomon (RS) decoding module, wherein the device further comprises an LDPC codeword check decision module and an RS decoding mode selection module, wherein the LDPC decoding module is configured to: complete soft decision iterative decoding of an LDPC code, output an information bit of the decoded LDPC codeword to the de-byte-interleave module, and output the information bit and a check bit of the decoded LDPC codeword to the LDPC codeword check decision module;

the LDPC codeword check decision module is configured to carry out check decision on the decoded LDPC codeword and output check information to the de-byte-interleave module;

the de-byte-interleave module is configured to: convert the information bit of the LDPC codeword into a form of byte for de-interleave outputting, and extract RS codeword to an RS decoding module, and convert the check information of the LDPC codeword into puncturing information of the RS codeword, and output to the RS decoding mode selection module;

the RS decoding mode selection module is configured to complete selection of mode of the RS decoding according to the puncturing information of the RS codeword outputted by the de-byte-interleave module, and output a selection result to the RS decoding module;

the RS decoding module is configured to complete error correction decoding or erasure decoding of the RS codeword according to the selection result outputted by the RS decoding mode selection module.

The LDPC codeword check decision module can be configured to carry out check decision on the decoded LDPC codeword according to the following manner: multiplying a check matrix H by a transposed matrix of a hard decision codeword C after decoding, if a product is zero, then deciding that the codeword C is checked to be correct, and recording that a value of an error flag corresponding to the codeword C is correct; if the product is not zero, then deciding that the codeword C is checked to be error, and recording that the value of the error flag corresponding to the codeword C is error. The de-byte-interleave module is configured to convert the check information of the LDPC codeword into the puncturing information of the RS codeword according to the following manner: repeating the error flag corresponding to each LDPC codeword for L times to be the puncturing information of a column corresponding to that LDPC codeword, wherein L is a ratio of length of the information bit of that LDPC codeword to length of the column of an interleaver, and L is an positive integral number. The RS decoding mode selection module is configured to complete the selection of the RS decoding mode according to the following manner: if a number of locations to be punctured of the RS codeword is within in a correctable range of RS erasure decoding, then selecting an erasure decoding mode; if the number of the locations to be punctured is not within in the correctable range, then selecting an error correction decoding mode. Wherein the number of locations to be punctured of the RS codeword being within in the correctable range of the RS erasure decoding refers to: the number of the locations to be punctured is less than or equal to a number of RS check bits of the RS codeword.

Wherein the de-byte-interleave module is configured to convert the information bit of the LDPC codeword into the form of byte for de-interleave outputting according to the following manner: writing the LDPC codeword into an interleaver in order of column and reading out in order of row.

By the decoding solution of the concatenated code composed of RS code and LDPC code in the present invention, the performance of RS decoding can be improved without increasing the computation complexity, thus greatly improving the receiving performance of the CMMB terminal as compared to the conventional method.

PREFERRED EMBODIMENTS OF THE INVENTION

Figure 1:
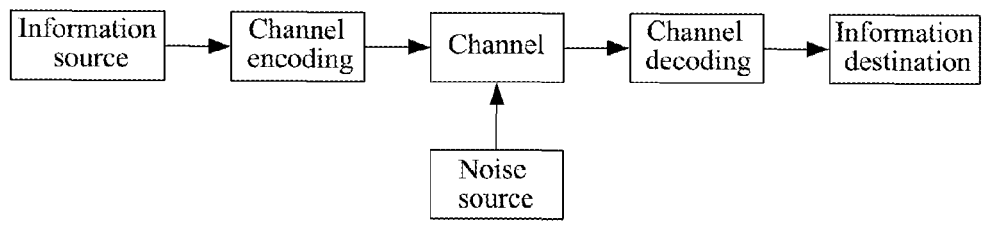
FIG. 1 is a simulation model diagram of an existing digital communication system.

The present invention provides a decoding method for concatenated code, applied in the decoding of the concatenated code composed of RS code and LDPC code and suitable to a CMMB system, and it mainly includes the following steps:

in step a, carrying out LDPC soft decision iterative decoding on bit de-interleaved data flow, and carrying out check decision on LDPC codeword obtained from decoding by using a check matrix;

in step b, carrying out de-byte-interleave on an information bit of the LDPC codeword obtained from decoding and converting check information of the LDPC codeword into puncturing information of RS codeword; and in step c, selecting a decoding mode according to the puncturing information of the RS codeword to carry out RS decoding.

Wherein, in step a, a BP algorithm based soft decision decoding algorithm can be selected for the LDPC decoding operation and parity check can be performed on the LDPC codeword (i.e. hard decision codeword C, including information bit and check bit) obtained from decoding by way of mod 2 sum operation: if the product of the check matrix H and the transposed matrix of hard decision codeword C is zero, then codeword C is checked to be correct, and if this product is not zero, then the codeword C is checked to be error. In particular, assuming that the hard decision codeword C outputted after decoding is a row vector with the length thereof being N, the check matrix H is a matrix with M rows and N columns, if $H \cdot C^T = 0^T$, then the codeword C is checked to be correct, and at the same time, the error flag err_flag corresponding thereto is set as 0, which indicates that the codeword C is decoded correctly; and if the above product is not zero, then the value of err_flag is set as 1, which indicates that the codeword C is decoded wrongly.

Furthermore, in step b, carrying out de-byte-interleave on the LDPC codeword refers to: converting the information bit of the LDPC codeword obtained after decoding into the form of byte for de-interleave outputting.

Since the LDPC codeword in the byte interleaver is stored in order of column, it can be known according to the CMMB protocol that the information bit length of each LDPC codeword is L times of the length of the column of the interleaver (L is a positive integer), therefore, the check information of the LDPC codeword can be converted into the puncturing information of the RS codeword according to the following manner: repeating the error flag err_flag corresponding to each LDPC codeword for L times to be the puncturing information corresponding thereto.

Furthermore, in step c, the process of selecting a decoding mode according to the puncturing information of the RS codeword includes:

if the number of locations of the RS codeword to be punctured is within in the correctable range of the RS erasure decoding, then selecting the erasure decoding mode; and if not within in the correctable range, then selecting the error correction decoding mode.

In this case, the number of locations to be punctured of the RS codeword being within in the correctable range of the RS erasure decoding refers to: the number of locations to be punctured is less than or equal to the number of RS check bits.

Furthermore, the above locations to be punctured refer to the location of the error flag (err_flag is 1) in a sequence obtained by way of err_flag, and the number of locations to be punctured refers to the number of error flags in this sequence.

Hereinafter, the technical solution of the present invention will be further described in detail in conjunction with the accompanying drawings and particular embodiments.

Figure 2:
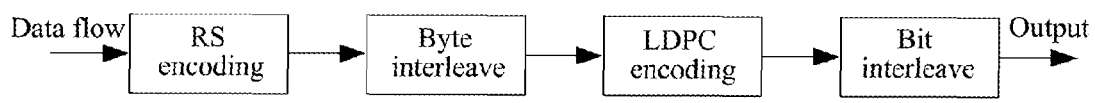
FIG. 2 is a flowchart of channel encoding in a CMMB system in the related art.
Figure 3:
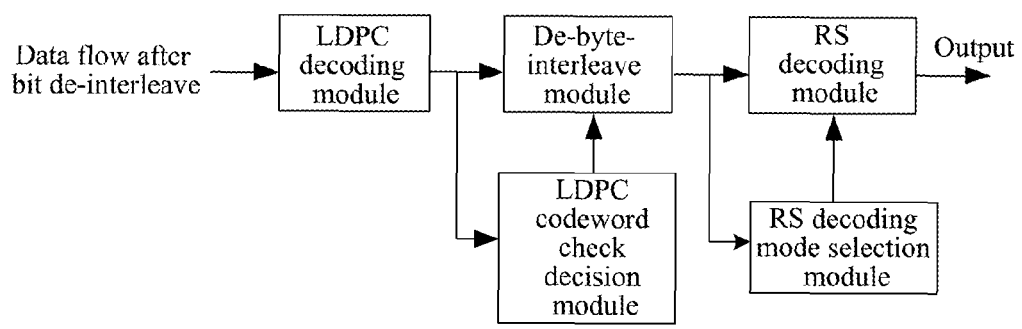
FIG. 3 is a schematic block diagram of a decoding device for concatenated code according to the embodiments of the present invention.

As shown in FIG. 2, the decoding device for concatenated code provided by the embodiments of the present invention includes:

the LDPC decoding module is configured to: complete soft decision iterative decoding of an LDPC code, output an information bit of the decoded LDPC codeword to the de-byte-interleave module, and output the information bit and a check bit of the decoded LDPC codeword to the LDPC codeword check decision module;

the LDPC codeword check decision module is configured to complete check decision on the decoded LDPC codeword and output check information to the de-byte-interleave module;

the de-byte-interweave module is configured to: convert the information bit of the LDPC codeword into a form of byte for de-interleave outputting, and extract RS codeword to an RS decoding module, and convert the check information of the LDPC codeword into puncturing information of the RS codeword, and output to the RS decoding mode selection module;

the RS decoding mode selection mode is configured to complete selection of mode of the RS decoding according to the puncturing information of the RS codeword outputted by the de-byte-interleave module, and output a selection result to the RS decoding module;

the RS decoding module is configured to complete error correction decoding or erasure decoding of the RS codeword according to the selection result outputted by the RS decoding mode selection module.

In this case, the above LDPC decoding module is configured to complete the soft decision iterative decoding of the LDPC code and output the hard decision codeword C after the bit de-interleave outputting of the receiver.

In this case, the above LDPC codeword check decision module completes the parity check decision on the codeword C by way of mod 2 sum operation according to hard decision codeword C outputted by the LDPC decoding module and the LDPC check matrix H. Assuming that C is a row vector with the length thereof being N and H is a matrix with M rows and N columns, if $H \cdot C^T = 0^T$, then the codeword C is checked correctly and at the same time the error flag err_flag corresponding thereto is set as 0; and if the above product is not 0, then set err_flag=1, which indicates that the codeword C is decoded wrongly.

In this case, the above de-byte-interleave module is respectively connected to the output of the LDPC decoding module and LDPC codeword check decision module and configured to convert the information bit of the LDPC decoding result into the form of byte for de-interleave outputting, and at the same time convert the check information of the LDPC codeword into the puncturing information of the RS codeword for outputting. Since the LDPC codeword in the byte interleaver is stored in order of column, it can be known according to the CMMB protocol that the information bit length of each LDPC codeword is L (L is a positive integer) times of the length of the column (i.e. the number of columns) of the interleaver, the error flag err_flag corresponding to each LDPC codeword is repeated for L times to be the puncturing information of the column corresponding thereto.

In this case, the above RS decoding mode selection module makes decision according to the puncturing information outputted by the de-byte-interleave module and selects the corresponding decoding mode: if the number of locations to be punctured is within the correctable range of the RS erasure decoding, then select the erasure decoding mode; and if not within this range, then select the error correction decoding mode. The number of locations to be punctured being within in the correctable range of the RS erasure decoding refers to: the number of locations of the RS code to be punctured is less than or equal to the number of RS check bits.

In this case, the above RS decoding module is connected to the de-byte-interleave module and the decoding mode selection module respectively, and the RS decoding module can carry out two kinds of decoding modes such as error correction decoding and erasure decoding, and decides the operation of the corresponding decoding mode according to the output of the RS decoding mode selection module.

Hereinafter, the decoding method for concatenated code in the present invention will be further described in detail in conjunction with particular embodiments.

The decoding method in this embodiment can be applied to the CMMB system, and it mainly includes the following steps.

In step 101, the LDPC decoding operation of the bit de-interleaved data flow is completed and the hard decision codeword C is outputted.

In this case, the input of the LDPC decoding module is information of the bit log likelihood ratio, the existing BP algorithm based soft decision decoding algorithm can be selected for the LDPC decoding operation, and the length of the hard decision codeword C outputted after the LDPC decoding is completed is 9216 bits.

In step 102, parity check is carried out on the hard decision codeword C using the check matrix H.

As to the LDPC code with 1/2 code rate, H is a matrix with 4048 rows and 9216 columns; and as to the LDPC code with 3/4 code rate, H is a matrix with 2304 rows and 9216 columns If $H \cdot C^T = 0^T$, then the codeword C is checked to be correct, and at the same time, the error flag err_flag corresponding thereto is set as 0; and if the above product is not 0, then set err_flag=1, which indicates that the codeword C is decoded wrongly. In this case, the product of H and C can be viewed as a series of mod 2 sum operations, and the computation manner thereof is as follows: add the value of the codeword C corresponding to the location of the non-zero element in each row of H and carry out mod 2 operation thereon, if the calculation results of all the rows are 0, then $H \cdot C^T = 0^T$; and if there appears the situation that the calculation result of a certain row is not 0, then the codeword C is decoded wrongly, and then the subsequent mod 2 sum operation can be stopped.

In step 103, the information bit of the LDPC decoding result is converted into the form of byte for de-interleave outputting, and at the same time, the check information of the LDPC codeword is converted into the puncturing information of the RS codeword.

In this case, the byte conversion method is as follows: dividing each 8 bits of the information bit of the LDPC codeword into one group, and convert each group into the representation in the GF(256) domain in an order of low bit priority.

In this case, the de-interleave method is: writing the LDPC codeword into the interleaver in order of column and reading out in order of row.

In this case, the implementation step of converting the check information of the LDPC codeword into the puncturing information of the RS codeword is: assuming the information bit length of the LDPC codeword is M, then the byte length is M/8; and assuming the number of rows of the byte interleaver is R, then the number of columns of the byte interweaver occupied by one LDPC is L=M/(8R). The error flag err_flag corresponding to each LDPC codeword is repeated for L times to be the puncturing information of the column corresponding thereto.

In step 104, a decision is made according to the puncturing information of the converted RS codeword to select the corresponding RS decoding mode.

The implementation step thereof is: calculate the number E of err_flag being 1 according to the error flag err_flag obtained in the above step 103, as to the RS code used in the system, assuming that the length of its code is N-byte, and the length of the information bit is K-byte, if E is less than or equal to N−K (i.e. the number of RS check bits), then output the erasure decoding mode selection flag; and if E is greater than N−K, then output the error correction decoding mode selection flag.

In step 105, a decoding operation is carried out on the RS codeword according to the RS codeword obtained in step 103 and the decoding mode selection flag obtained in step 104.

Figure 4:
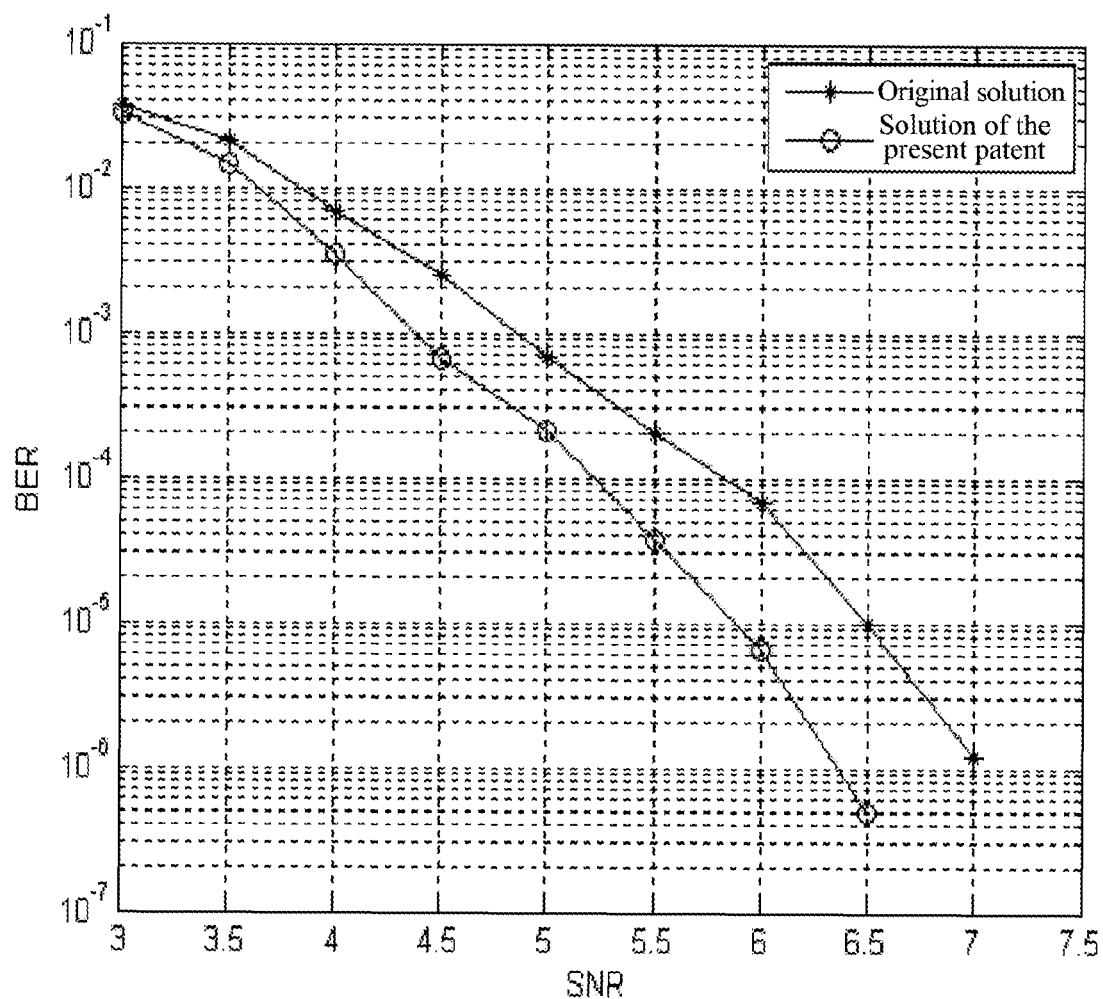
FIG. 4 is a simulation diagram of performance contrast between a decoding method in the present invention and a conventional decoding method.

FIG. 4 shows the performance contrast between the decoding solution in the present invention and the convention solution when the maximum Doppler frequency shift is 100 Hz, wherein the vertical coordinate is BER (Bit Error Rate), and the horizontal coordinate is SNR (Signal to Noise Ratio), and it can be seen from FIG. 4 that as compared to the conventional solution, by way of the decoding solution provided by the present invention, the decoding performance can be improved by about 0.7 dB.

Of course, the present invention can have several other embodiments, and those skilled in the art can make various corresponding modifications and variations according to the present invention without departing from the spirit and essence of the present invention, and these corresponding modifications and variations shall belong to the scope of protection of the appended claims of the present invention.

INDUSTRIAL APPLICABILITY

As compared to the related art, in the present invention, the RS decoding performance can be improved without increasing the computation complexity, thus greatly improving the receiving performance of the CMMB terminal as compared to the conventional method.

What we claim is:

1. A decoding method for concatenated code, wherein the method is used for decoding concatenated code composed of low density parity code (LDPC) and Reed-Solomon (RS) code, the method comprising:
   carrying out LDPC soft decision iterative decoding on bit de-interleaved data flow, and carrying out check decision on LDPC codeword obtained from decoding by using a check matrix;
   carrying out de-byte-interleave on an information bit of the LDPC codeword obtained from decoding and converting check information of the LDPC codeword into puncturing information of RS codeword; and
   selecting a decoding mode according to the puncturing information of the RS codeword to carry out RS decoding.

2. The method as claimed in claim 1, wherein the step of carrying out check decision on LDPC codeword obtained from decoding by using a check matrix comprises:
   multiplying a check matrix H by a transposed matrix of a hard decision codeword C obtain from decoding, if a product is zero, then deciding that the codeword C is checked to be correct, and recording that a value of an error flag corresponding to the codeword C is correct; if the product is not zero, then deciding that the codeword C is checked to be error, and recording that the value of the error flag corresponding to the codeword C is error.

3. The method as claimed in claim 2, wherein the step of converting check information of the LDPC codeword into puncturing information of RS codeword comprises:
   repeating the error flag corresponding to each LDPC codeword for L times to be the puncturing information of a column corresponding to that LDPC codeword, wherein L is a ratio of length of the information bit of that LDPC codeword to length of the column of an interleaver, and L is an positive integral number.

4. The method as claimed in claim 3, wherein the step of selecting a decoding mode according to the puncturing information of the RS codeword to carry out RS decoding comprises:
   if a number of locations to be punctured of the RS codeword is within in a correctable range of RS erasure decoding, then selecting an erasure decoding mode; if the number of the locations to be punctured of the RS codeword is not within in the correctable range of the RS erasure decoding, then selecting an error correction decoding mode.

5. The method as claimed in claim 4, wherein the number of locations to be punctured of the RS codeword being within in the correctable range of the RS erasure decoding refers to the number of the locations to be punctured is less than or equal to a number of RS check bits of the RS codeword.

6. The method as claimed in claim 1, wherein the step of carrying out de-byte-interleave on the LDPC codeword obtained from decoding is as follows:
   writing the LDPC codeword obtained from decoding into an interleaver in order of column and reading the same out in order of row.

7. A decoding device for concatenated code, comprising a low density parity code (LDPC) decoding module, a de-byte-interleave module and a Reed-Solomon (RS) decoding module, wherein the device further comprises an LDPC codeword check decision module and an RS decoding mode selection module, wherein
   the LDPC decoding module is configured to complete soft decision iterative decoding of an LDPC codeword, output an information bit of the decoded LDPC codeword to the de-byte-interleave module, and output the information bit and a check bit of the decoded LDPC codeword to the LDPC codeword check decision module;
   the LDPC codeword check decision module is configured to carry out check decision on the decoded LDPC codeword and output check information to the de-byte-interleave module;
   the de-byte-interleave module is configured to: convert the information bit of the LDPC codeword into a form of byte for de-interleave outputting, and extract RS codeword to an RS decoding module, and convert the check information of the LDPC codeword into puncturing information of the RS codeword, and output to the RS decoding mode selection module;
   the RS decoding mode selection module is configured to complete selection of mode of the RS decoding according to the puncturing information of the RS codeword outputted by the de-byte-interleave module, and output a selection result to the RS decoding module;
   the RS decoding module is configured to complete error correction decoding or erasure decoding of the RS codeword according to the selection result outputted by the RS decoding mode selection module.

8. The device as claimed in claim 7, wherein the LDPC codeword check decision module is configured to carry out check decision on the decoded LDPC codeword according to the following manner:
   multiplying a check matrix H by a transposed matrix of a hard decision codeword C after decoding, if a product is zero, then deciding that the codeword C is checked to be correct, and recording that a value of an error flag corresponding to the codeword C is correct; if the product is not zero, then deciding that the codeword C is checked to be error, and recording that the value of the error flag corresponding to the codeword C is error.

9. The device as claimed in claim 8, wherein the de-byte-interleave module is configured to convert the check information of the LDPC codeword into the puncturing information of the RS codeword according to the following manner:
   repeating the error flag corresponding to each LDPC codeword for L times to be the puncturing information of a column corresponding to that LDPC codeword, wherein L is a ratio of length of the information bit of that LDPC codeword to length of the column of an interleaver, and L is an positive integral number.

10. The device as claimed in claim 9, wherein the RS decoding mode selection module is configured to complete the selection of the RS decoding mode according to the following manner:
    if a number of locations to be punctured of the RS codeword is within in a correctable range of RS erasure decoding, then selecting an erasure decoding mode; if the number of the locations to be punctured of the RS codeword is not within in the correctable range, then selecting an error correction decoding mode.

11. The device as claimed in claim 10, wherein the number of locations to be punctured of the RS codeword being within in the correctable range of the RS erasure decoding refers to the number of the locations to be punctured is less than or equal to a number of RS check bits of the RS codeword.

12. The device as claimed in claim 7, wherein the de-byte-interleave module is configured to convert the information bit of the LDPC codeword into the form of byte for de-interleave outputting according to the following manner: writing the LDPC codeword into an interleaver in order of column and reading out in order of row.

* * * * *